United States Patent [19]

Yoshioka et al.

[11] 4,314,268
[45] Feb. 2, 1982

[54] INTEGRATED CIRCUIT WITH SHIELDED LEAD PATTERNS

[75] Inventors: Takakazu Yoshioka; Masayuki Kurozumi, both of Tokyo, Japan

[73] Assignee: Nippon Electric Co., Ltd., Tokyo, Japan

[21] Appl. No.: 44,140

[22] Filed: May 31, 1979

[30] Foreign Application Priority Data

May 31, 1978 [JP] Japan ............................ 53-66041

[51] Int. Cl.³ ............................................. H01L 27/04
[52] U.S. Cl. ......................................... 357/48; 357/50; 357/53; 357/84
[58] Field of Search .................... 357/48, 53, 84, 51, 357/14, 50

[56] References Cited

U.S. PATENT DOCUMENTS

| | | | |
|---|---|---|---|
| 3,373,323 | 3/1968 | Wolfrum et al. | 357/54 |
| 3,573,571 | 4/1971 | Brown et al. | 357/84 |
| 3,582,727 | 6/1971 | Granger et al. | 357/53 |
| 3,631,311 | 12/1971 | Engbert | 357/48 |
| 3,700,977 | 10/1972 | Lunn | 357/48 |

FOREIGN PATENT DOCUMENTS 1614248  4/1979  Fed. Rep. of Germany ........ 357/84

*Primary Examiner*—William D. Larkins
*Attorney, Agent, or Firm*—Sughrue, Mion, Zinn, Macpeak and Seas

[57] ABSTRACT

A semiconductor integrated circuit device is designed to prevent capacitive coupling between a wiring layer and respective circuit elements in the integrated circuit device. A plurality of island regions are provided along one major surface of a semiconductor substrate, and an insulating film is formed on the one major surface of the substrate. A first wiring layer on the insulating film is connected at a first contact section to an impurity region of one conductivity type within one island region among the plurality of island regions. A second wiring layer on the insulating film is connected at a second contact section to a first impurity region of opposite conductivity type within the one island region. A third wiring layer on the insulating film is connected to another island region among the plurality of island regions and extends over the portion of the one island region between the first contact section and the first impurity region of opposite conductivity type. A second impurity region of the opposite conductivity type is provided along the one major surface in the portion of the one island region under the third wiring layer and separated from the first impurity region of the opposite conductivity type.

6 Claims, 11 Drawing Figures

INTEGRATED CIRCUIT WITH SHIELDED LEAD PATTERNS

FIELD OF THE INVENTION

The present invention relates to a semiconductor integrated circuit device, and more particularly to a semiconductor integrated circuit device such as a high frequency amplifier circuit or the like.

BACKGROUND OF THE INVENTION

Heretofore, in a semiconductor integrated circuit device, a silicon oxide film that is an insulator is provided over an integrated circuit formed in a semiconductor substrate, and wiring layers are disposed on the silicon oxide film for wiring respective elements composing the integrated circuit under the silicon oxide film to each other and bonding pads for connecting to external electrodes. For the purpose of reducing chip area, it has been generally known to pass wiring layers such as metallic wirings of aluminum or bonding pads over the respective elements, especially over a collector region. However, between a wiring layer passing, for example, over a collector region and that collector region, there is formed a parasitic capacitor using the silicon oxide film as a dielectric material, especially in a high frequency amplifier circuit or the like, and this results in undesired local feed-back through this parasitic capacitor, causing abnormal oscillation, deterioration in performance, etc. Such troubles cannot be foreseen at the stage of design, so that cut and try must be repeated until such troubles are eliminated, which prolongs the time required for design of a semiconductor integrated circuit device. Therefore, in general, in order to prevent the troubles caused by parasitic capacitors, it has been the practice to avoid overlapping between a wiring layer and an element which is liable to form the parasitic capacitor in question. However, according to this method a wiring layer is compelled to make a detour, resulting in an increase in chip area, and this in turn raises the cost of the semiconductor integrated circuit devices. In addition, an increase of resistance due to the increased length of the wiring layer causes additional troubles such as degradation of performance.

SUMMARY OF THE INVENTION

One object of the present invention is to prevent capacitive coupling between a wiring layer and respective circuit elements in a semiconductor integrated circuit device, especially in high frequency amplifier circuits.

Another object of the present invention is to prevent capacitive coupling between a wiring layer connected to one circuit element and extending over an insulating film on a semiconductor substrate and another circuit element located under this insulating film without being accompanied by an increase in chip area and an increase of resistance of the wiring layers.

According to one feature of the present invention, there is provided a semiconductor integrated circuit device comprising a semiconductor substrate, a plurality of island regions or active regions of one conductivity type extending inside of one major surface of said semiconductor substrate and surrounded by an isolation region, a wiring layer connected to a predetermined portion of at least one of said island regions and extending over one major surface of another island region by the intermediary of an insulating film, and a region of opposite conductivity type extending inside of said one major surface of said another island region in the portion just under said wiring layer. In the case where bipolar transistors are respectively provided in said island regions, said region of one conductivity type is a collector region, and in this collector region are formed a base region of opposite conductivity type and an emitter region of said one conductivity type, respectively. Then in order to prevent capacitive coupling between the collector region and a wiring layer connected to another island region, a region of opposite conductivity type is provided in the portion of the collector region located under the wiring layer and separated from the base region. Moreover, if this region of opposite conductivity type of the present invention is designed to have the same depth and the same impurity concentration as those of the base region, both regions can be formed in the same process step.

In the case where an isolation region surrounding an island region of one conductivity type is made of a semiconductor layer of opposite conductivity type, that is, in the case of a P-N junction separation type device, it is desirable to provide the aforementioned region of opposite conductivity type under the wiring layer as connected to the isolation region. Since this isolation region is normally grounded, the capacitor formed between the wiring layer and the region of opposite conductivity type located thereunder would be grounded at one end. Therefore, circuit elements would not be capacitively coupled by the intermediary of a wiring layer.

Alternatively, the aforementioned region of opposite conductivity type under the wiring layer could be provided as separated from the isolation region. In such a case, or in the case where the isolation region is formed of a thick field oxide layer, the region of opposite conductivity type under the wiring layer can be held not only at the substrate potential but also at another fixed potential by a source of the potential. This fixed potential is effective so long as it is selected within the potential range from the lowest potential in the semiconductor integrated circuit device to the potential of the region of one conductivity type in which that region of opposite conductivity type is to be provided, that is, to the potential of the collector region. In the case where the collector potential is varied in accordance with a signal, naturally the effective range of the applied potential is limited by the lowest potential at the collector. Also it is to be noted that a source of the potential to be applied to this region of opposite conductivity type whose impedance as viewed from this region is lower, is more effective.

DESCRIPTION OF PREFERRED EMBODIMENTS

Figure 1:
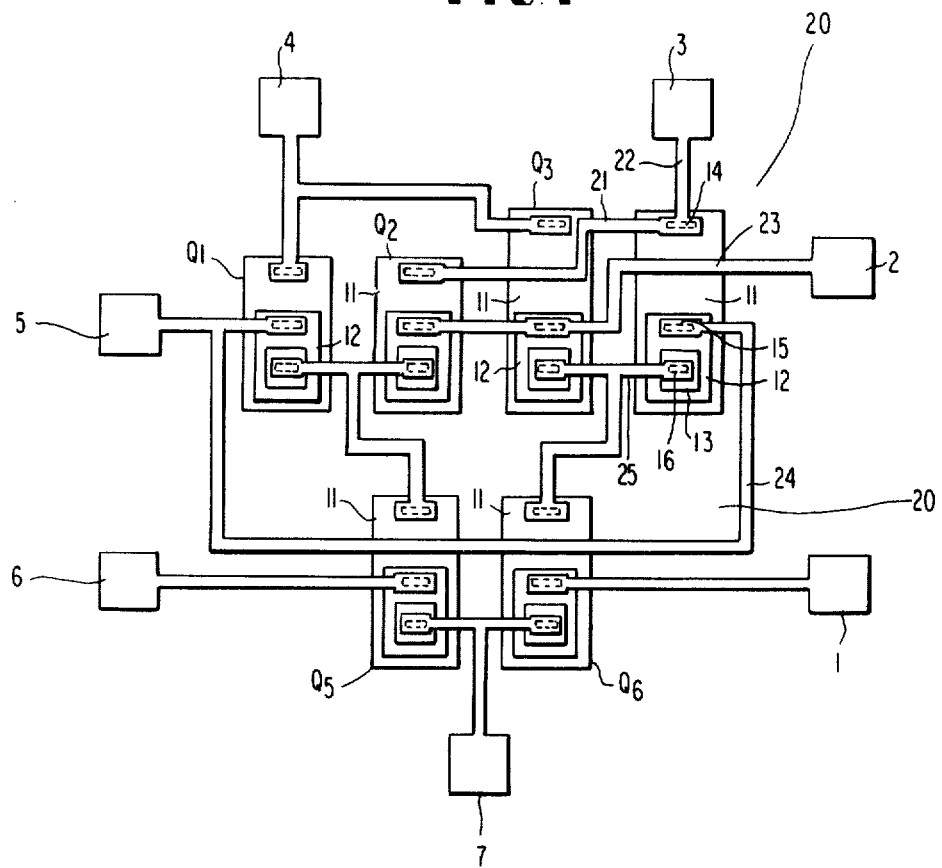
FIG. 1 is a schematic plan view showing a twin differential amplifier as one example of semiconductor integrated circuit devices to which the present invention is applicable.
Figure 2:
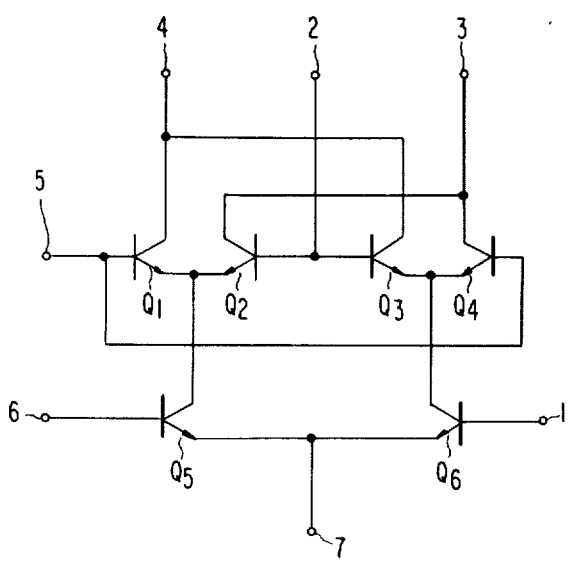
FIG. 2 shows an equivalent circuit diagram for the device shown in FIG. 1.

Referring to FIG. 1 showing a twin differential amplifier formed in a semiconductor substrate, bipolar transistors $Q_1$ to $Q_6$ are respectively formed in six active regions surrounded by an isolation region. Each bipolar transistor is composed of a collector region 11 of one conductivity type, a base region 12 of opposite conductivity type provided within the collector region, an emitter region 13 of said one conductivity type provided within the base region, a collector contact section 14, a base contact section 15 and an emitter contact section 16. The respective circuit elements are connected to each other through wiring layers such as, for example, metallic wirings 21 to 24, and these wirings lead to bonding pads 1 to 7 disposed at peripheral portions of the semiconductor integrated circuit device for connecting to external electrodes. In FIG. 2 is shown an equivalent circuit for the device illustrated in FIG. 1. The reference numerals 1 to 7 for the terminals in FIG. 2 correspond to the bonding pads 1 to 7, respectively, in FIG. 1.

Figure 3:
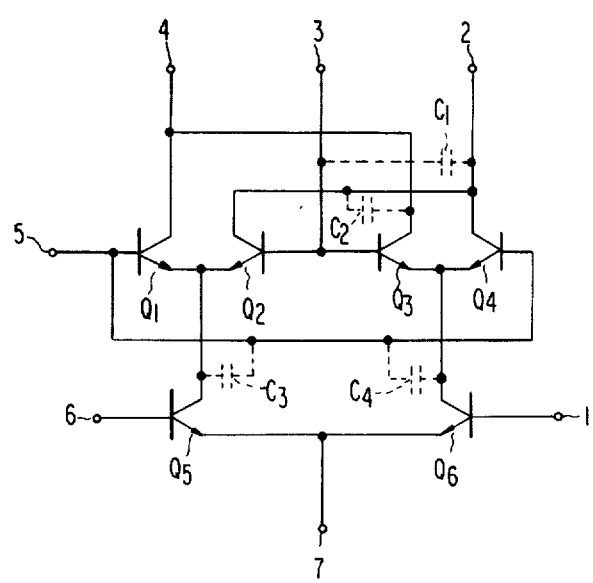
FIG. 3 is an equivalent circuit diagram showing the mode of association of parasitic capacitors in the device shown in FIGS. 1 and 2 in the prior art.

The positions of the bonding pads 1 to 7 in FIG. 1 are determined depending upon the arrangement of an external circuit to be connected to the semiconductor integrated circuit device, and on the other hand, in view of the resistance of a wiring layer as well as the degree of integration of the device, in some cases the wiring layer connected to a given region of one transistor may extend over a collector region of another transistor by the intermediary of an insulating film as described previously. More particularly, with reference to FIG. 1, a wiring layer 23 connected to a base region 12 of a transistor $Q_3$ extends over a collector region 11 of a transistor $Q_4$, a wiring layer 21 connected to collector regions 11 of transistors $Q_2$ and $Q_4$ extends over a collector region 11 of a transistor $Q_3$, and a wiring layer 24 connecting a base region 12 of a transistor $Q_1$ to a base region 12 of a transistor $Q_4$ extends over collector regions 11 of the transistors $Q_5$ and $Q_6$. Consequently, parasitic capacitors $C_1$ to $C_4$ as shown in FIG. 3 are formed, so that the respective transistors are capacitively coupled, resulting in unnecessary local feedback.

Figure 4A:
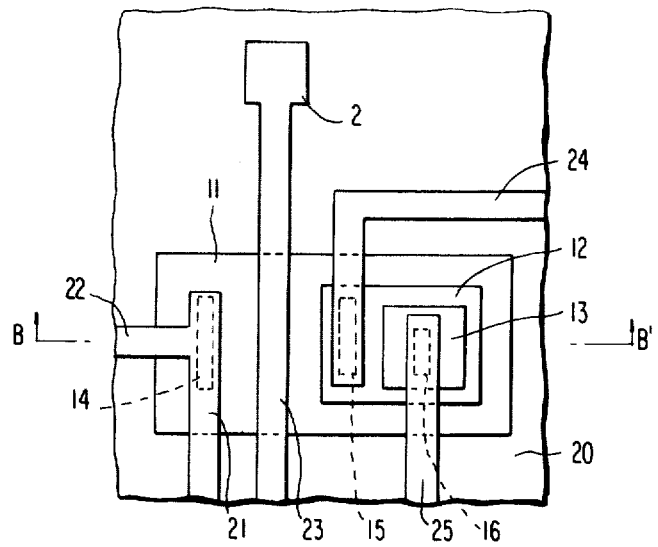
FIG. 4A is a plan view showing a part of the device in FIG. 1 as constructed in the prior art.
Figure 4B:
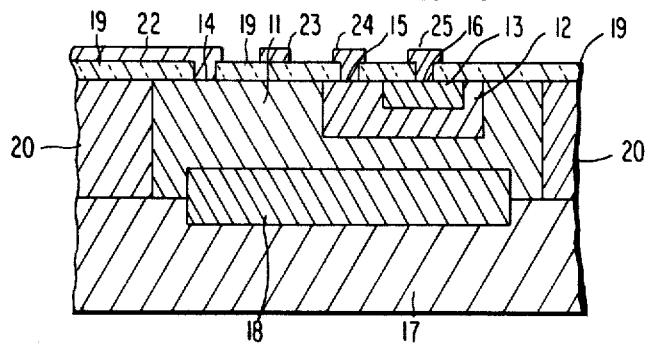
FIG. 4B is a cross-sectional view taken along line B—B' in FIG. 4A as viewed in the direction of the arrows.

With reference to FIGS. 4A and 4B showing in enlarged scale the proximity of the transistor $Q_4$ in FIG. 1 in a semiconductor integrated circuit device constructed according to the prior art, an epitaxial N-type collector region 11 of 11 μm is formed on a P-type semiconductor body 17 and surrounded by an epitaxial P-type isolation region 20 having an impurity concentration of $3 \times 10^{18}$ atoms/cm$^3$. The impurity concentration in this collector region 11 is $10^{15} \sim 10^{16}$ atoms/cm$^3$. Within this collector region 11 is formed a P-type base region 12, and within the P-type base region 12 is formed an N-type emitter region 13. Then, on the surface of the semiconductor substrate composed of the semiconductor body 17 and the epitaxial layer 11 and 20, that is, on the surface of the epitaxial layer is formed a silicon dioxide film 19 of about 0.5 μm in thickness, and through apertures formed in this insulator film 19 are connected wiring layers 22, 24 and 25 made of aluminum to a collector contact section 14 of the collector region 11, a base contact section 15 of the base region 12 and an emitter contact section 16 of the emitter region 13, respectively. In addition, for the purpose of reducing the resistance of a current path from the collector contact section 14 to the bottom of the base region 12, an N-type buried layer 18 made of high concentration antimony or the like having an impurity concentration of about $10^{18}$ atoms/cm$^3$ is provided at the boundary between the collector region 11 and the semiconductor body 17. The sheet resistance of this buried layer is $10 \sim 100\Omega/\square$, and therefore, although the collector contact section 14 is provided necessarily at an end portion of the collector region 11 as will be obvious from the construction shown in FIG. 1, the dynamic resistance of the collector region becomes immaterial.

On the other hand, the wiring layer 23 of aluminum having a width of 15 μm and connected to the base region 12 of the transistor $Q_3$ in FIG. 1 extends over the collector region 11 of the transistor $Q_4$ by the intermediary of the insulating film and is led to the bonding pad 2 as shown in FIGS. 4A and 4B. Accordingly, in this portion is formed a parasitic capacitor ($C_1$ in FIG. 3) consisting of the wiring layer 23, insulating film 19 and collector region 11. The capacity of this parasitic capacitor $C_1$ is as large as about 0.2 to 1 pF. Thereby the transistors $Q_3$ and $Q_4$ are capacitively coupled to each other. In the case where the bonding pad 2 is provided above the collector region 11 of the transistor $Q_4$ as a result of other design conditions, the capacity of this parasitic capacitor $C_1$ becomes as large as 1 to 5 pF.

Figure 5A:
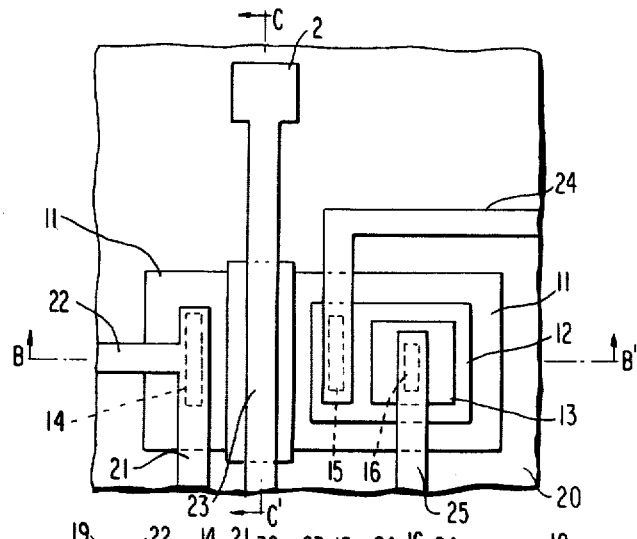
FIG. 5A is a plan view showing a part of the device in FIG. 1 as constructed according to one preferred embodiment of the present invention.
Figure 5B:
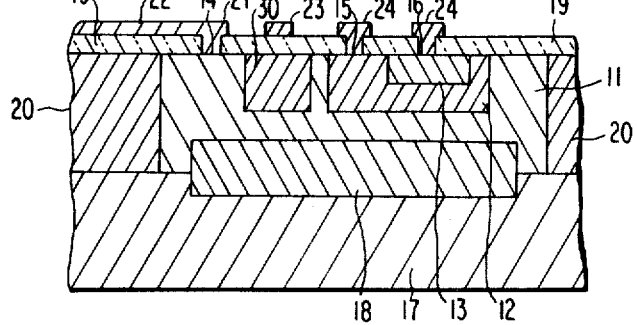
FIGS. 5B and 5C are cross-sectional views taken along lines B—B' and C—C', respectively, in FIG. 5A as viewed in the direction of the arrows.
Figure 5C:
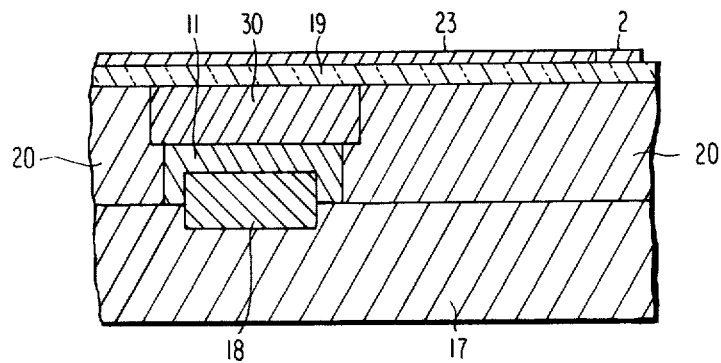

By contrast, in a semiconductor integrated circuit device constructed according to the present invention as illustrated in FIGS. 5A, 5B and 5C, under the wiring layer 23 of 15 μm in width is provided a P-type impurity region 30 of 20 μm in width whose end portions are contiguous to the P-type isolation region 20. The depth of this P-type impurity region 30 is 3 μm and its impurity concentration is $10^{18}$ atoms/cm$^3$, these being identical to those of the base region 12, so that the both regions 30 and 12 can be formed simultaneously. Owing to such a P-type impurity region 30, the parasitic capacity between the wiring layer 23 and the collector region 11 can be reduced to $1/10 \sim 1/30$ of the parasitic capacity in the device shown in FIGS. 4A and 4B in the prior art. In other words, the capacitive coupling between the transistors $Q_3$ and $Q_4$ becomes very small, and hence abnormal oscillation and deterioration in performance can be prevented. It is to be noted that in FIG. 5 items having the same functions as those shown in FIG. 4 are given like reference numerals.

Explaining now in more detail the semiconductor integrated circuit device shown in FIG. 5, on a P-type silicon body 17 having an N-type buried layer 18 formed therein is epitaxially grown an N-type silicon layer. This N-type silicon layer is isolated into a plurality of island regions by an isolation diffused region 20. One of the island regions is used as a collector region 11, and in this collector region 11 are formed a base region 12 and an emitter region 13. Within the collector region 11 is provided a P-type diffused region 30, and such a P-type diffused region 30 extends up to the isolation diffused region 20 outside of the collector region 11. Since the isolation diffused region 20 is of P-type, electrically such a P-type diffused region 30 takes the same potential as the isolation diffused region 20, and accordingly, such a P-type diffused region 30 would be the lowest potential region having a low impedance similar to the isolation diffused region 20 and the P-type semiconductor body 17. In addition, the P-type diffused region 30 is insulated from the collector region 11. The metallic wiring 23 to be connected to another circuit element is disposed on the insulator film 19 right above the P-type diffused region 30. Owing to such provision, the construction is deemed as if a shield plate is interposed between the metallic wiring 23 and the collector region 11, so that the capacitive coupling is eliminated and the aforementioned troubles can be obviated without increasing the chip area.

Moreover, since such a P-type diffused region 30 of the present invention can be formed simultaneously with the formation of other regions upon diffusion of the base regions 12 or upon diffusion of the isolation diffused region 20, the steps of the process would not be increased. Therefore, by practicing the present invention, the wiring layers such as the metallic wirings can be freely passed over any circuit elements, and lowering of cost due to reduction of a chip area and shortening of the design period can be realized without being associated with abnormal performance.

In the semiconductor integrated circuit device in the prior art shown in FIGS. 4A and 4B, the distance between the base region 12 and the collector contact section 14 is about 40 $\mu$m, and the overall collector series resistance is 40~600$\Omega$. On the other hand, in the semiconductor integrated circuit device according to the present invention illustrated in FIGS. 5A, 5B and 5C, because of the provision of the P-type impurity region 30, the aforementioned distance is increased to, for example, 60 $\mu$m, but since the length of the low resistance buried layer 18 is only increased correspondingly, the increase of the overall collector series resistance is only about 60$\Omega$, which is not objectionable in operation.

Figure 6A:
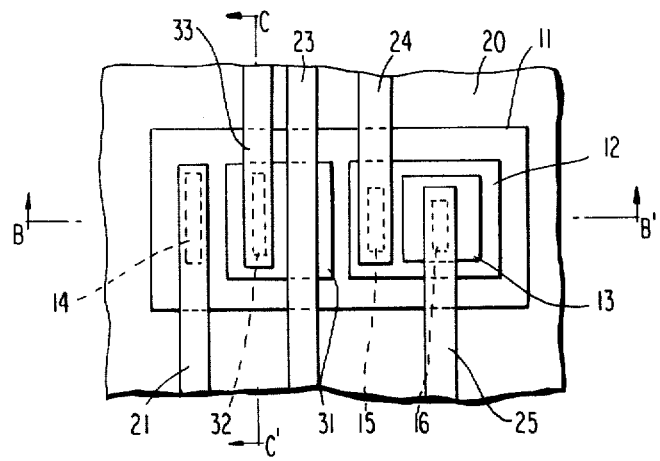
FIG. 6A is a plan view of another preferred embodiment of the present invention.
Figure 6B:
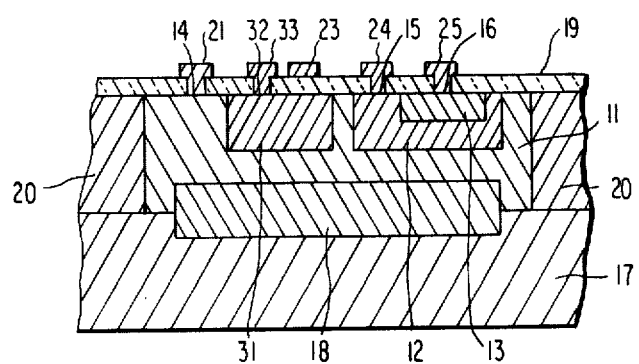
FIGS. 6B and 6C are cross-sectional views taken along lines B—B' and C—C', respectively, in FIG. 6A as viewed in the direction of the arrows.
Figure 6C:
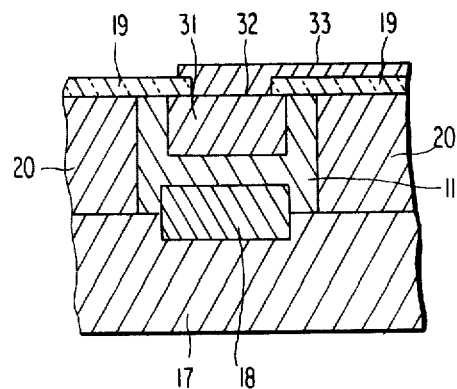

FIGS. 6A, 6B and 6C illustrate another preferred embodiment of the present invention, in which a P-type impurity region 31 according to the present invention is separated from the isolation region 20 by a distance of about 10 $\mu$m, and the region 31 can be held at any given potential through a wiring layer 33 which is connected to the region 31 via a contact section 32. This potential is preferably selected in the range from the lowest potential in the semiconductor integrated circuit device to the collector potential of the transistor, and the potential source for feeding this potential of the region 31 should preferably have a small impedance as viewed from the region 31. It is to be noted that in FIG. 6 items having the same functions as those shown in FIGS. 4 and 5 are given like reference numerals. As described above, the potential of the P-type impurity region provided under the wiring layer according to the present invention is not limited to the potential of the semiconductor body 17, but the P-type impurity region is likewise effective even when it is held at a different fixed potential, and such mode of operation is applicable to a semiconductor integrated circuit device according to the present invention in which the insulator separation layer is formed of a thick field oxide layer. In the modified embodiment shown in FIG. 6, the width of the P-type impurity region 31 is, for example, about 40 $\mu$m, and in this case the distance between the collector contact section 14 and the base region 12 is, for example, 80 $\mu$m. However, similarly to the embodiment shown in FIG. 5, the increase of the overall collector series resistance is not objectionable at all in operation.

While the present invention has been described above in connection to NPN transistors, it can be widely applied to PNP transistors, field effect transistors, diodes, and the like. In the case of PNP transistors, of course, the impurity regions to be provided in the collector regions according to the present invention are of N-type. In addition, while the wiring layers were metallic wiring layers in the above-described embodiments, wiring layers consisting of semiconductor layers could be used without any disadvantage.

What is claimed is:

1. A semiconductor integrated circuit device comprising a semiconductor substrate, an isolation region, a plurality of island regions provided along one major surface of said semiconductor substrate, each said island region being substantially surrounded by said isolation region, an insulating film formed on said one major surface of said semiconductor substrate, a first wiring layer on said insulating film connected at a first contact section to an impurity region of one conductivity type within one island region among said plurality of island regions, a second wiring layer on said insulating film connected at a second contact section to a first impurity region of opposite conductivity type within said one island region, and separated from said isolation region, a third wiring layer on said insulating film connected to another island region among said plurality of island regions and extending over the portion of said one island region between said first contact section and said first impurity region of opposite conductivity type, a bonding pad formed on said isolation region and connected electrically to said third wiring layer, a second impurity region of said opposite conductivity type provided along said one major surface in the portion of said one island region under said third wiring layer and remote from said bonding pad and separated from said first impurity region of said opposite conductivity type, and a forth wiring layer on said insulating film connected to another predetermined portion of said second impurity region of said opposite conductivity type except for the portion under said third wiring layer, said second impurity region of said opposite conductivity type being held at a fixed potential through said forth wiring layer.

2. A semiconductor integrated circuit device as claimed in claim 1, in which said impurity region of one conductivity type is a collector region, said first impurity region of said opposite conductivity type is a base region, and the portion of the island region directly under said third wiring layer is located between a collector contact section and said base region.

3. A semiconductor integrated circuit device as claimed in claim 1, in which each said isolation region is a semiconductor layer of said opposite conductivity type.

4. A semiconductor integrated circuit device comprising a semiconductor substrate, a plurality of transistors provided along one major surface of said semiconductor substrate, an isolation region substantially surrounding these respective transistors to isolate the respective transistors from each other, an insulating film provided on said one major surface of said semiconductor substrate, a plurality of bonding pads provided on said isolation region of the peripheral portions of said semiconductor substrate, and wiring layers extending on said insulating film for interconnecting said transistors to each other and respectively connected to said bonding pads; in which each said transistor includes a collector region of one conductivity type that is contiguous to said isolation region, a collector wiring layer connected to a collector contact section of said collector region, a base region of the opposite conductivity type provided within said collector region and separated from said isolation region, a base wiring layer connected to a base contact section of said base region, an emitter region of said one conductivity type provided within said base region, an emitter wiring layer connected to an emitter contact section of said emitter region, a region of said opposite conductivity type provided along said one major surface in the portion of said collector region between said base region and said collector contact section, remote from said bonding pad and separated from said base region, a wiring layer connected to another transistor extending above said region of said opposite conductivity type and insulated therefrom by said insulating film on said one major surface, and a connecting wiring layer for said region of said opposite conductivity type on said insulating film connected to another predetermined portion of said region of said opposite conductivity type except for the portion directly under said wiring layer, said region of said opposite conductivity type being held at a fixed potential through said connecting wiring layer.

5. A semiconductor integrated circuit device comprising a semiconductor substrate, a plurality of island regions provided along one major surface of said semiconductor substrate, an insulating film formed on said one major surface of said semiconductor substrate, a first wiring layer on said insulating film connected at a first contact section to an impurity region of one conductivity type within one island region among said plurality of island regions, a second wiring layer on said insulating film connected at a second contact section to a first impurity region of opposite conductivity type within said one island region, a third wiring layer on said insulating film connected to another island region among said plurality of island regions and extending over the portion of said one island region between said first contact section and said first impurity region of opposite conductivity type, a second impurity region of said opposite conductivity type provided along said one major surface in the portion of said one island region under said third wiring layer and separated from said first impurity region of said opposite conductivity type, an isolation region of a semiconductor layer of said opposite conductivity type surrounding each said island region, said second impurity region of said opposite conductivity type being isolated from said isolation region, and a fourth wiring layer on said insulating film connected to another predetermined portion of said second impurity region of said opposite conductivity type except for the portion directly under said third wiring layer, said second impurity region of said opposite conductivity type being held at a fixed potential through said fourth wiring layer.

6. A semiconductor integrated circuit device comprising a semiconductor substrate, a plurality of island regions provided along one major surface of said semiconductor substrate, an insulating film formed on said one major surface of said semiconductor substrate, a first wiring layer on said insulating film connected at a first contact section to an impurity region of one conductivity type within one island region among said plurality of island regions, a second wiring layer on said insulating film connected at a second contact section to a first impurity region of opposite conductivity type within said one island region, a third wiring layer on said insulating film connection to another island region among said plurality of island regions and extending over the portion of said one island region between said first contact section and said first impurity region of opposite conductivity type, a second impurity region of said opposite conductivity type provided along said one major surface in the portion of said one island region under said third wiring layer and separated from said first impurity region of said opposite conductivity type, an isolation region of a thick field insulating layer surrounding each said island region, and a fourth wiring layer connected to another predetermined portion of said second impurity region of said opposite conductivity type except for the portion directly under said third wiring layer, said second impurity region of said opposite conductivity type being held at a fixed potential through said fourth wiring layer.

* * * * *